United States Patent
Waseda et al.

(10) Patent No.: US 11,848,203 B2
(45) Date of Patent: *Dec. 19, 2023

(54) METHODS OF PROCESSING SUBSTRATE AND MANUFACTURING SEMICONDUCTOR DEVICE BY FORMING FILM, SUBSTRATE PROCESSING APPARATUS, AND RECORDING MEDIUM

(71) Applicant: KOKUSAI ELECTRIC CORPORATION, Tokyo (JP)

(72) Inventors: Takayuki Waseda, Toyama (JP); Takashi Nakagawa, Toyama (JP); Kimihiko Nakatani, Toyama (JP); Motomu Degai, Toyama (JP); Takao Izaki, Toyama (JP); Yoshitomo Hashimoto, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 187 days.

This patent is subject to a terminal disclaimer.

(21) Appl. No.: 17/132,608

(22) Filed: Dec. 23, 2020

(65) Prior Publication Data
US 2021/0202245 A1 Jul. 1, 2021

(30) Foreign Application Priority Data
Dec. 27, 2019 (JP) .................. 2019-237905

(51) Int. Cl.
*C23C 16/04* (2006.01)
*H01L 21/02* (2006.01)
(Continued)

(52) U.S. Cl.
CPC ........ *H01L 21/02312* (2013.01); *C23C 16/04* (2013.01); *C23C 16/325* (2013.01);
(Continued)

(58) Field of Classification Search
CPC ...... C23C 16/04; C23C 16/345; C23C 16/401
See application file for complete search history.

(56) References Cited

U.S. PATENT DOCUMENTS 5,194,530 A * 3/1993 Stevens ................... C08C 19/44
526/337
5,864,161 A  1/1999 Mitani et al.
(Continued)

FOREIGN PATENT DOCUMENTS

CN    1214537 A    4/1999
CN  101252087 A    8/2008
(Continued)

OTHER PUBLICATIONS

Ushakova, Alexandra, et al., "Study of the Radical Chain Mechanism of Hydrocarbon Oxidation for In Situ Combustion Process". Journal of Combustion, vol. 2017, Article ID 2526596, p. 1-11.*
(Continued)

*Primary Examiner* — Bret P Chen
(74) *Attorney, Agent, or Firm* — Volpe Koenig

(57) ABSTRACT

A technique includes: (a) modifying a surface of a first base exposed on a surface of a substrate to be terminated with a hydrocarbon group by supplying a hydrocarbon group-containing gas to the substrate having the first base and a second base exposed on the surface of the substrate; and (b) forming a film on a surface of the second base by supplying an oxygen- and hydrogen-containing gas to the substrate after modifying the surface of the first base.

24 Claims, 8 Drawing Sheets

(51) Int. Cl.
  *C23C 16/52* (2006.01)
  *C23C 16/40* (2006.01)
  *C23C 16/32* (2006.01)
  *C23C 16/455* (2006.01)
  *C23C 16/46* (2006.01)

(52) U.S. Cl.
  CPC ...... *C23C 16/401* (2013.01); *C23C 16/45534* (2013.01); *C23C 16/45544* (2013.01); *C23C 16/46* (2013.01); *C23C 16/52* (2013.01); *H01L 21/0228* (2013.01); *H01L 21/02126* (2013.01); *H01L 21/02304* (2013.01); *H01L 21/02359* (2013.01)

(56) References Cited

U.S. PATENT DOCUMENTS

| | | | |
|---|---|---|---|
| 6,136,722 A | 10/2000 | Nambu | |
| 8,013,021 B2 * | 9/2011 | MacQueen | C08G 81/00 |
| | | | 525/425 |
| 9,793,107 B2 | 10/2017 | Noda et al. | |
| 10,157,740 B1 * | 12/2018 | Ouyang | B05D 1/322 |
| 2005/0287728 A1 * | 12/2005 | Arias | H10K 10/466 |
| | | | 438/197 |
| 2007/0281448 A1 | 12/2007 | Chen et al. | |
| 2008/0213479 A1 | 9/2008 | Chou et al. | |
| 2014/0170858 A1 | 6/2014 | Harada et al. | |
| 2014/0287595 A1 | 9/2014 | Shimamoto et al. | |
| 2014/0287596 A1 | 9/2014 | Hirose et al. | |
| 2015/0072537 A1 | 3/2015 | Noda et al. | |
| 2015/0332916 A1 | 11/2015 | Noda et al. | |
| 2016/0024659 A1 | 1/2016 | Shimamoto et al. | |
| 2016/0155634 A1 | 6/2016 | Shimamoto et al. | |
| 2016/0225617 A1 | 8/2016 | Noda et al. | |
| 2016/0284542 A1 | 9/2016 | Noda et al. | |
| 2017/0051405 A1 * | 2/2017 | Fukazawa | C23C 16/36 |
| 2017/0207082 A1 | 7/2017 | Wang et al. | |
| 2017/0278705 A1 | 9/2017 | Murakami et al. | |
| 2017/0342553 A1 | 11/2017 | Yu et al. | |
| 2018/0012752 A1 | 1/2018 | Tapily | |
| 2018/0199432 A1 | 7/2018 | Thompson et al. | |
| 2018/0202042 A1 | 7/2018 | Fafard et al. | |
| 2018/0204732 A1 | 7/2018 | Kamakura et al. | |
| 2018/0211833 A1 | 7/2018 | Li et al. | |
| 2018/0218898 A1 | 8/2018 | Hirose et al. | |
| 2018/0233349 A1 * | 8/2018 | Smith | C23C 16/0272 |
| 2018/0254179 A1 | 9/2018 | Chan et al. | |
| 2018/0315840 A1 | 11/2018 | Chui et al. | |
| 2019/0080904 A1 | 3/2019 | Anthis et al. | |
| 2019/0148144 A1 * | 5/2019 | Liu | C23C 16/00 |
| | | | 257/632 |
| 2019/0218666 A1 | 7/2019 | Harada et al. | |
| 2019/0341476 A1 | 11/2019 | Chui et al. | |
| 2020/0140995 A1 * | 5/2020 | Blanquart | H01L 21/0262 |
| 2020/0234943 A1 | 7/2020 | Bhuyan et al. | |
| 2021/0043448 A1 | 2/2021 | Li et al. | |
| 2021/0074584 A1 | 3/2021 | Tapily | |
| 2021/0098258 A1 | 4/2021 | Degai et al. | |
| 2021/0143001 A1 | 5/2021 | Ashihara et al. | |
| 2021/0166948 A1 | 6/2021 | Degai et al. | |
| 2021/0272803 A1 * | 9/2021 | Nakatani | H01L 21/30604 |
| 2021/0305043 A1 * | 9/2021 | Nakatani | C23C 16/04 |

FOREIGN PATENT DOCUMENTS

| | | |
|---|---|---|
| CN | 101454877 A | 6/2009 |
| JP | 2013-243193 A | 12/2013 |
| JP | 2014-135475 A | 7/2014 |
| JP | 2014-183218 A | 9/2014 |
| JP | 2015-053445 A | 3/2015 |
| JP | 2017-130665 A | 7/2017 |
| JP | 2017-174919 A | 9/2017 |
| JP | 2017-222928 A | 12/2017 |
| JP | 2018-125416 A | 8/2018 |
| JP | 2018-523289 A | 8/2018 |
| JP | 2018-523917 A | 8/2018 |
| JP | 2019-096877 A | 6/2019 |
| KR | 2015-0029517 A | 3/2015 |
| KR | 10-2018-0038473 A | 4/2018 |
| KR | 10-2018-0120062 A | 11/2018 |
| KR | 10-2019-0101508 A | 8/2019 |
| KR | 2019-0101508 A | 8/2019 |
| KR | 10-2020-0019271 A | 2/2020 |
| SG | 10202013019 | 7/2021 |
| TW | 201448038 A | 12/2014 |
| TW | I540643 B | 7/2016 |
| WO | 2018/088003 A1 | 5/2018 |
| WO | 2019/018379 A1 | 1/2019 |
| WO | 2019/027738 A1 | 2/2019 |
| WO | 2019/229785 A1 | 12/2019 |
| WO | 2020/016914 A1 | 1/2020 |
| WO | 2020/016915 A1 | 1/2020 |

OTHER PUBLICATIONS

Mackus, Adriaan J.M., et al., "From the Bottom-Up: Toward Area-Selective Atomic Layer Deposition with High Selectivity". Chemistry of Materials 2019, 31, 2-12.*
Mameli, Alfredo, et al., "Area-Selective Atomic Layer Deposition of SiO2 Using Acetylacetone as a Chemoselective Inhibitor in an ABC-Type Cycle". ACS Nano 2017, 11, 9303-9311.*
Korean Office Action dated Nov. 9, 2022 for Korean Patent Application No. 10-2020-0182802.
Japanese Office Action dated Feb. 8, 2022 for Japanese Patent Application No. 2019-237905.
Singapore Written Opinion dated Aug. 30, 2022 for Singapore Patent Application No. 10202013019Q.
Singapore Written Opinion dated Nov. 1, 2021 for Singapore Patent Application No. 10202013019Q.
Singapore Search Report dated Nov. 1, 2021 for Singapore Patent Application No. 10202013019Q.
Taiwanese Office Action dated Aug. 13, 2021 for Taiwanese Patent Application No. 109141041.
Korean Office Action dated Nov. 9, 2022 for Korean Patent Application No. 10-2021-0025526.
Taiwan Office Action dated Jan. 18, 2022 for Taiwan Patent Application No. 110101023.
Japanese Office Action dated Jan. 25, 2022 for Japanese Patent Application No. 2020-132129.
Korean Office Action dated Nov. 25, 2022 for Korean Patent Application No. 10-2021-0033356.
Japanese Office Action dated Jul. 19, 2022 for Japanese Patent Application No. 2020-055107.
Taiwan Office Action dated Jan. 27, 2022 for Taiwan Patent Application No. 110102617.
Singapore Search Report dated Feb. 10, 2022 for Singapore Patent Application No. 10202102589W.
Singapore Written Opinion dated Feb. 10, 2022 for Singapore Patent Application No. 10202102589W.
Singapore Search Report dated Feb. 16, 2022 for Singapore Patent Application No. 10202101966W.
Singapore Written Opinion dated Feb. 16, 2022 for Singapore Patent Application No. 10202101966W.
Japanese Office Action dated Feb. 1, 2022 for Japanese Patent Application No. 2020-055107.
Chinese Office Action dated Jul. 17, 2023 for Chinese Patent Application No. 202011522199.6.

* cited by examiner

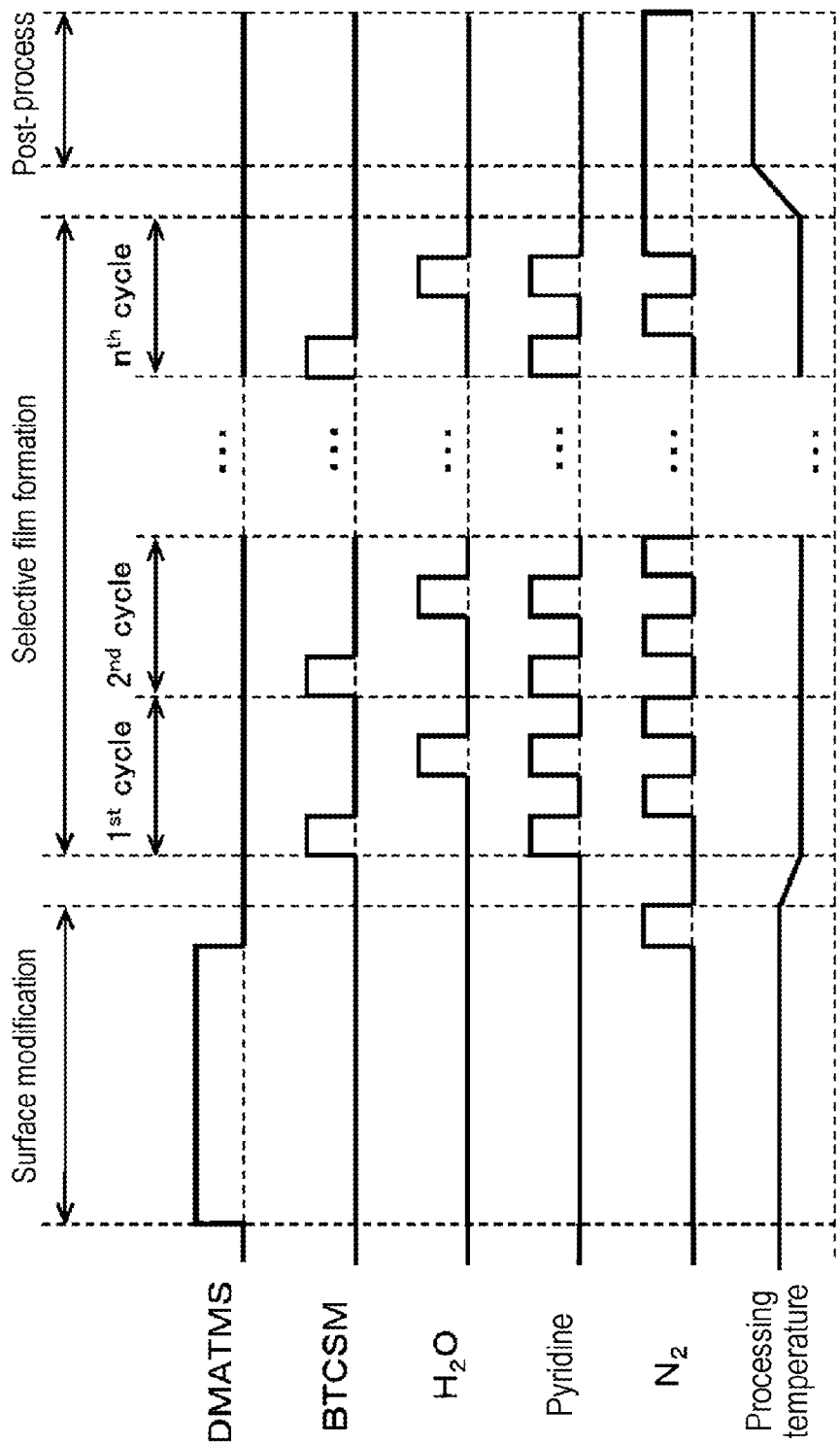

METHODS OF PROCESSING SUBSTRATE AND MANUFACTURING SEMICONDUCTOR DEVICE BY FORMING FILM, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2019-237905, filed on Dec. 27, 2019, the entire contents of which are incorporated herein by reference.

TECHNICAL FIELD

The present disclosure relates to a method of manufacturing a semiconductor device, a substrate processing apparatus, and a recording medium.

BACKGROUND

In the related art, as a process of manufacturing a semiconductor device, a process of selectively growing and forming a film on a surface of a specific base among a plurality of types of bases exposed on a surface of a substrate (this process is also hereinafter referred to as selective growth or selective film formation) may be often carried out.

SUMMARY

Some embodiments of the present disclosure provide a technique capable of increasing a selectivity in the above-mentioned selective growth.

According to an embodiment of the present disclosure, there is provided a technique that includes: (a) modifying a surface of a first base exposed on a surface of a substrate to be terminated with a hydrocarbon group by supplying a hydrocarbon group-containing gas to the substrate having the first base and a second base exposed on the surface of the substrate; and (b) selectively forming a film on a surface of the second base by supplying an oxygen- and hydrogen-containing gas to the substrate after modifying the surface of the first base.

BRIEF DESCRIPTION OF DRAWINGS

The accompanying drawings, which are incorporated in and constitute a part of the specification illustrate embodiments of the present disclosure.

FIG. 4 is a diagram showing a process sequence in selective growth according to embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

EMBODIMENTS

Embodiments of the present disclosure will be now described mainly with reference to FIGS. 1 to 4.

(1) Configuration of Substrate Processing Apparatus

Figure 1:
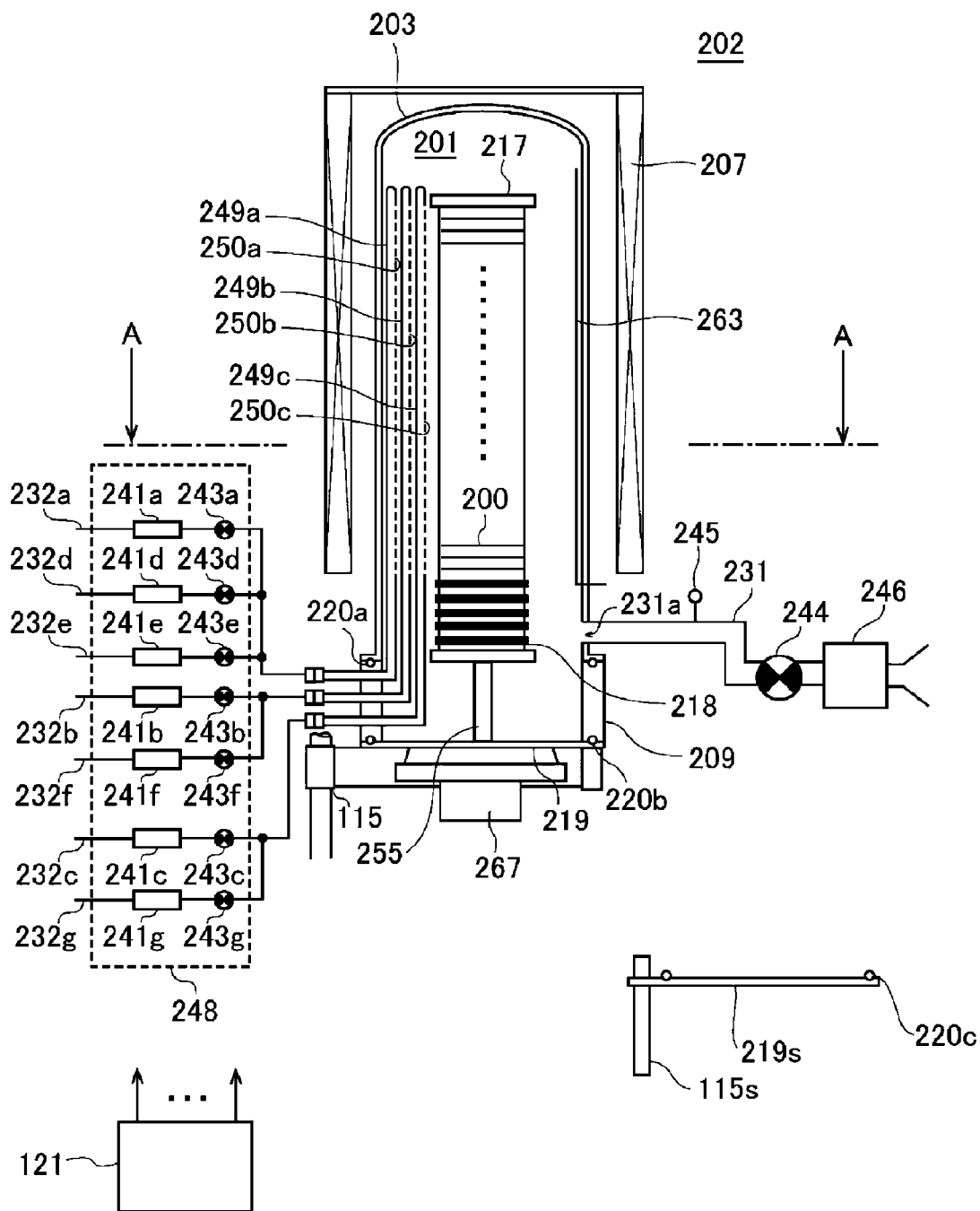
FIG. 1 is a schematic configuration view of a vertical process furnace 202 of a substrate processing apparatus suitably used in embodiments of the present disclosure, in which a portion of the process furnace 202 is shown in a vertical cross section.

As illustrated in FIG. 1, a process furnace 202 includes a heater 207 as a temperature regulator (heating part). The heater 207 has a cylindrical shape and is supported by a holding plate to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, for example, quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of a metal material, for example, stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A processing vessel (reaction vessel) mainly includes the reaction tube 203 and the manifold 209. A process chamber 201 is formed in a hollow cylindrical portion of the processing vessel. The process chamber 201 is configured to be capable of accommodating wafers 200 as substrates. The processing of the wafers 200 is performed in the process chamber 201.

Nozzles 249a to 249c as first to third supply parts are installed in the process chamber 201 to penetrate a sidewall of the manifold 209. The nozzles 249a to 249c will be referred to as first to third nozzles, respectively. The nozzles 249a to 249c are each made of a heat resistant material such as quartz, SiC or the like. Gas supply pipes 232a to 232c are connected to the nozzles 249a to 249c respectively. The nozzles 249a to 249c are different nozzles, in which each of the nozzles 249a to 249c is installed adjacent to the nozzle 249b.

Mass flow controllers (MFCs) 241a to 241c, which are flow rate controllers (flow rate control parts), and valves 243a to 243c, which are opening/closing valves, are installed in the gas supply pipes 232a to 232c, respectively, sequentially from the upstream side of gas flow. Gas supply pipes 232d and 232e are connected to the gas supply pipe 232a at the downstream side of the valves 243a. Gas supply pipes 232f and 232g are connected to the gas supply pipes 232b and 232c at the downstream side of the valves 243b and 243c, respectively. MFCs 241d to 241g and valves 243d to 243g are installed at the gas supply pipes 232d to 232g, respectively, sequentially from the upstream side of gas flow. The gas supply pipes 232a to 232g are made of, for example, a metal material such as SUS or the like.

Figure 2:
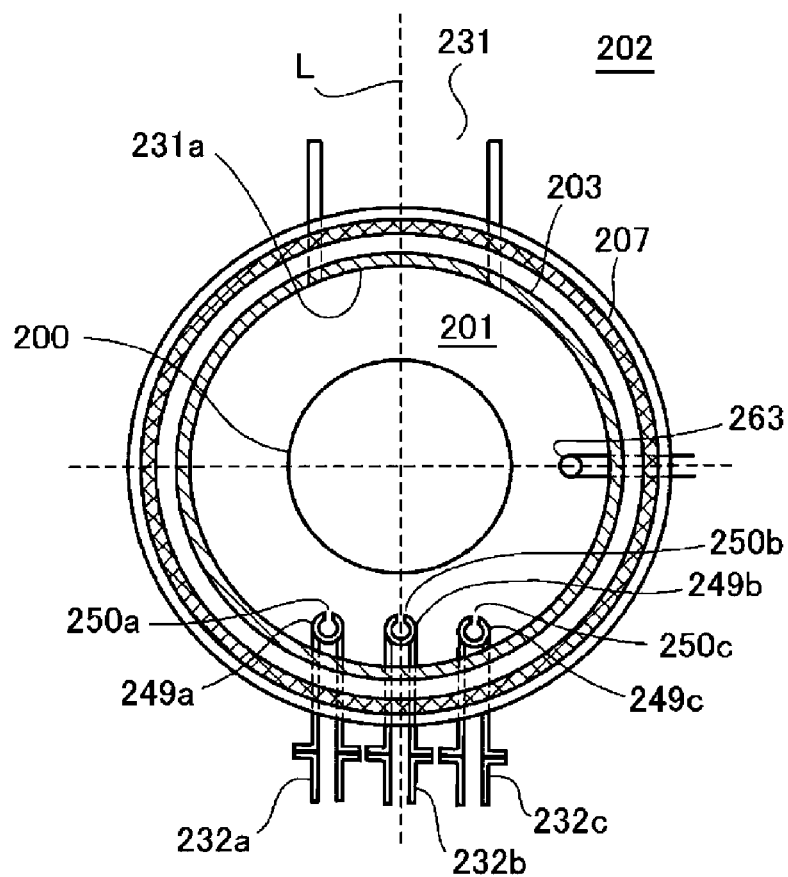
FIG. 2 is a schematic configuration view of the vertical process furnace 202 of the substrate processing apparatus suitably used in the embodiments of the present disclosure, in which a portion of the process furnace 202 is shown in a cross section taken along a line A-A in FIG. 1.

As illustrated in FIG. 2, the nozzles 249a to 249c are disposed in a space with an annular plan-view shape between the inner wall of the reaction tube 203 and the wafers 200 such that the nozzles 249a to 249c extend upward along an arrangement direction of the wafers 200 from a lower portion to an upper portion of the inner wall of the reaction tube 203. Specifically, the nozzles 249a to 249c are installed at a lateral side of a wafer arrangement region in which the wafers 200 are arranged, namely in a region which horizontally surrounds the wafer arrangement region, to extend along the wafer arrangement region. The nozzle 249b is disposed to face an exhaust port 231a, which will be described later, on a straight line in a plane view, with centers of the wafers 200 loaded into the process chamber 201 interposed therebetween. The nozzles 249a and 249c are disposed to sandwich a straight line L passing through the nozzle 249b and a center of the exhaust port 231a from both sides along the inner wall of the reaction tube 203 (an outer peripheral portion of the wafers 200). The straight line L is also a straight line passing through the nozzle 249b and the centers of the wafers 200. That is, it may be said that the nozzle 249c is installed at the opposite side of the nozzle 249a with the straight line L interposed therebetween. The nozzles 249a and 249c are disposed in line symmetry with the straight line L as a symmetry axis. Gas supply holes 250a to 250c configured to supply a gas are installed on the side surfaces of the nozzles 249a to 249c, respectively. The gas supply holes 250a to 250c are opened to face the exhaust port 231a in the plane view, thus allowing a gas to be supplied toward the wafers 200. The gas supply holes 250a to 250c may be formed in a plural number between the lower portion and the upper portion of the reaction tube 203.

A hydrocarbon group-containing gas as a surface modifying gas is supplied from the gas supply pipe 232a into the process chamber 201 via the MFC 241a, the valve 243a, and the nozzle 249a.

As the hydrocarbon group-containing gas, for example, a gas containing an alkyl group may be used. As the gas containing the alkyl group, for example, a gas containing an alkylsilyl group in which the alkyl group is coordinated with silicon (Si), that is, an alkyl silane-based gas, may be used. The alkyl group is a general term for remaining atomic groups obtained by removing one hydrogen (H) atom from an alkane (chain saturated hydrocarbon represented by a general formula $C_nH_{2n+2}$), and is a functional group represented by a general formula $C_nH_{2n+1}$. The alkyl group includes a methyl group, an ethyl group, a propyl group, a butyl group, and the like. Since the alkyl group is bonded to Si, which is the central atom of the alkyl silane molecule, the alkyl group in the alkyl silane may also be referred to as a ligand or an alkyl ligand.

The hydrocarbon group-containing gas may further contain an amino group. As the hydrocarbon group- and amino group-containing gas, for example, an alkyl aminosilane-based gas may be used. The amino group refers to a functional group obtained by coordinating one or two hydrocarbon groups containing one or more carbon C atoms to one nitrogen (N) atom (a functional group obtained by substituting one or both of H of an amino group represented by $NH_2$ by a hydrocarbon group containing one or more C atoms). When two hydrocarbon groups constituting a portion of the amino group are coordinated to one N, the two may be the same hydrocarbon group or different hydrocarbon groups. The hydrocarbon group may contain a single bond like an alkyl group, or may contain an unsaturated bond such as a double bond or a triple bond. The amino group may have a cyclic structure. Since the amino group is bonded to Si, which is the central atom of the aminosilane molecule, the amino group in the aminosilane may also be referred to as a ligand or an amino ligand.

Figure 5A:
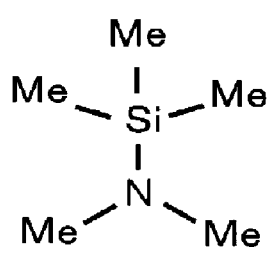
FIG. 5A is a diagram showing a chemical structural formula of DMATMS.

As the hydrocarbon group-containing gas, for example, an alkyl aminosilane-based gas such as dimethylaminotrimethylsilane (($CH_3$)$_2$NSi($CH_3$)$_3$, abbreviation: DMATMS) gas containing an alkylsilyl group and an amino group may be used. As shown in the chemical structural formula in FIG. 5A, three alkyl groups (methyl groups, Me) and one amino group (dimethylamino group) are bonded to Si, which is the central atom of DMATMS. That is, DMATMS contains three alkyl ligands and one amino ligand.

A Si- and halogen-containing gas as a precursor (precursor gas) is supplied from the gas supply pipe 232b into the process chamber 201 via the MFC 241b, the valve 243b, and the nozzle 249b. The halogen includes chlorine (Cl), fluorine (F), bromine (Br), iodine (I), and the like. The Si- and halogen-containing gas may contain the halogen in the form of a chemical bond between Si and halogen. The Si- and halogen-containing gas may further contain C, in which case C may be contained in the form of a Si—C bond. As the Si- and halogen-containing gas, for example, a silane-based gas containing Si, Cl and an alkylene group and containing a Si—C bond, that is, an alkylene chlorosilane-based gas, may be used. The alkylene group includes a methylene group, an ethylene group, a propylene group, a butylene group, and the like. The alkylene chlorosilane-based gas may contain Cl in the form of a Si—Cl bond and C in the form of a Si—C bond. As the alkylene chlorosilane-based gas, for example, a bis(trichlorosilyl) methane $((SiCl_3)_2CH_2$, abbreviation: BTCSM) gas may be used.

An oxygen (O)- and H-containing gas as an oxidizing agent (oxidizing gas) is supplied from the gas supply pipe 232c into the process chamber 201 via the MFC 241c, the valve 243c, and the nozzle 249c. The O- and H-containing gas may contain an O—H bond. As the O- and H-containing gas, for example, water ($H_2O$ gas) may be used.

A catalyst (catalyst gas) is supplied from the gas supply pipe 232d into the process chamber 201 via the MFC 241d, the valve 243d, the gas supply pipe 232a, and the nozzle 249a. As the catalyst, for example, an amine-based gas containing C, N, and H may be used. As the amine-based gas, for example, a pyridine ($C_5H_5N$) gas may be used.

An inert gas, for example, a nitrogen ($N_2$) gas, is supplied from the gas supply pipes 232e to 232g into the process chamber 201 via the MFCs 241e to 241g, the valves 243e to 243g, the gas supply pipes 232a to 232c, and the nozzles 249a to 249c, respectively. The $N_2$ gas acts as a purge gas, a carrier gas, a dilution gas, or the like.

A hydrocarbon group-containing gas supply system mainly includes the gas supply pipe 232a, the MFC 241a, and the valve 243a. A Si- and halogen-containing gas supply system mainly includes the gas supply pipe 232b, the MFC 241b, and the valve 243b. An O- and H-containing gas supply system mainly includes the gas supply pipe 232c, the MFC 241c, and the valve 243c. A catalyst supply system mainly includes the gas supply pipe 232d, the MFC 241d, and the valve 243d. An inert gas supply system mainly includes the gas supply pipes 232e to 232g, the MFCs 241e to 241g, and the valves 243e and 243g.

One or all of various supply systems described above may be configured as an integrated supply system 248 in which the valves 243a to 243g, the MFCs 241a to 241g, and the like are integrated. The integrated supply system 248 is connected to each of the gas supply pipes 232a to 232g so that a supply operation of various kinds of gases into the gas supply pipes 232a to 232g, that is, an opening/closing operation of the valves 243a to 243g, a flow rate regulating operation by the MFCs 241a to 241g and the like, are controlled by a controller 121 to be described below. The integrated supply system 248 is configured as an integral type or division type integrated unit, and may be attached to or detached from the gas supply pipes 232a to 232g or the like on an integrated unit basis such that maintenance, replacement, expansion or the like of the integrated supply system 248 may be performed on the integrated unit basis.

The exhaust port 231a configured to exhaust an internal atmosphere of the process chamber 201 is installed at a lower side of the sidewall of the reaction tube 203. As illustrated in FIG. 2, the exhaust port 231a is installed at a position facing the nozzles 249a to 249c (the gas supply holes 250a to 250c) in the plane view, with the wafers 200 interposed therebetween. The exhaust port 231a may be installed between the lower portion and the upper portion of the sidewall of the reaction tube 203, that is, along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and so that the internal pressure of the process chamber 201 can be regulated by regulating an opening degree of the APC valve 244 based on pressure information detected by the pressure sensor 245 while operating the vacuum pump 246. An exhaust system mainly includes the exhaust pipe 231, the APC valve 244 and the pressure sensor 245. The vacuum pump 246 may be regarded as being included in the exhaust system.

A seal cap 219, which serves as a furnace opening lid configured to be capable of hermetically sealing a lower end opening of the manifold 209, is installed under the manifold 209. The seal cap 219 is made of a metal material such as stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217 to be described below is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism installed outside the reaction tube 203. The boat elevator 215 is configured as a transfer device (transfer mechanism) which loads and unloads (transfers) the wafers 200 into and from (out of) the process chamber 201 by moving the seal cap 219 up or down. A shutter 219s as a furnace opening lid capable of hermetically sealing the lower end opening of the manifold 209, with the boat 217 unloaded from the interior of the process chamber 201 by moving the seal cap 219 down, is installed under the manifold 209. The shutter 219s is made of a metal material such as stainless steel or the like, and is formed in a disc shape. An O-ring 220c as a seal member making contact with the lower end portion of the manifold 209 is installed on an upper surface of the shutter 219s. An opening/closing operation (an up-down movement operation, a rotational movement operation, or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a degree of supplying electric power to the heater 207 is regulated such that the interior of the process chamber 201 has a desired temperature distribution. The temperature sensor 263 is installed along the inner wall of the reaction tube 203.

Figure 3:
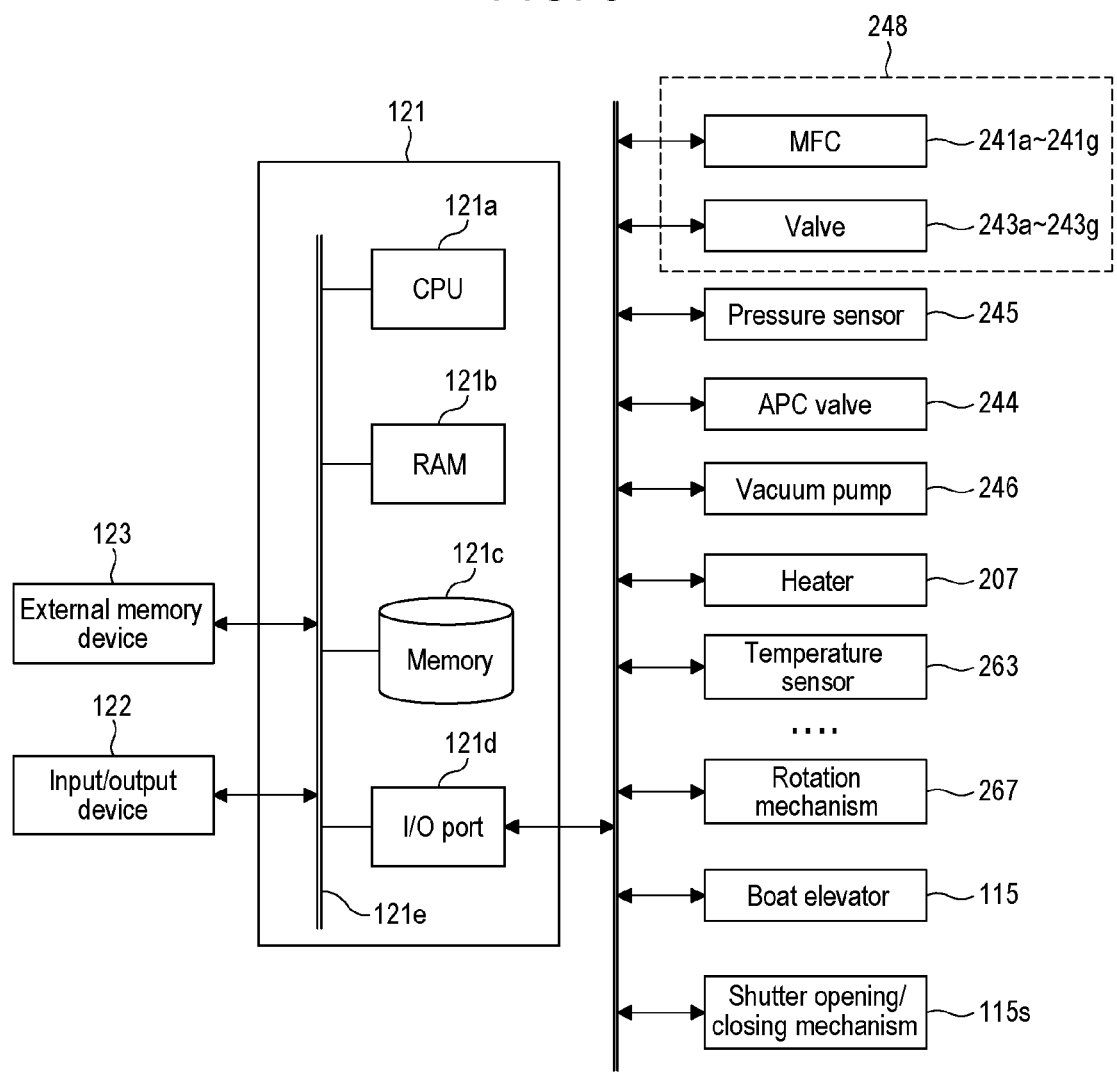
FIG. 3 is a schematic configuration diagram of a controller 121 of the substrate processing apparatus suitably used in the embodiments of the present disclosure, in which a control system of the controller 121 is shown in a block diagram.

As illustrated in FIG. 3, the controller 121, which is a control part (control means), may be configured as a computer including a central processing unit (CPU) 121a, a random access memory (RAM) 121b, a memory 121c, and an I/O port 121d. The RAM 121b, the memory 121c and the I/O port 121*d* are configured to be capable of exchanging data with the CPU 121*a* via an internal bus 121*e*. An input/output device 122 configured as, for example, a touch panel or the like, is connected to the controller 121.

The memory 121*c* includes, for example, a flash memory, a hard disk drive (HDD), or the like. A control program that controls operations of a substrate processing apparatus, a process recipe in which sequences, conditions and the like of substrate processing to be described below, and the like are readably stored in the memory 121*c*. The process recipe functions as a program configured to be capable of causing the controller 121 to execute each sequence in the substrate processing to be described below, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121*b* is configured as a memory area (work area) in which a program, data and the like read by the CPU 121*a* are temporarily stored.

The I/O port 121*d* is connected to the MFCs 241*a* to 241*g*, the valves 243*a* to 243*g*, the pressure sensor 245, the APC valve 244, the vacuum pump 246, the temperature sensor 263, the heater 207, the rotation mechanism 267, the boat elevator 115, the shutter opening/closing mechanism 115*s*, and the like, as described above.

The CPU 121*a* is configured to read the control program from the memory 121*c* and execute the same. The CPU 121*a* also reads the recipe from the memory 121*c* according to an input of an operation command from the input/output device 122. In addition, the CPU 121*a* is configured to control, according to the contents of the recipe thus read, the flow rate regulating operation of various kinds of gases by the MFCs 241*a* to 241*g*, the opening/closing operation of the valves 243*a* to 243*g*, the opening/closing operation of the APC valve 244, the pressure regulating operation performed by the APC valve 244 based on the pressure sensor 245, the driving and stopping of the vacuum pump 246, the temperature regulating operation performed by the heater 207 based on the temperature sensor 263, the operation of rotating the boat 217 and regulating the rotation speed of the boat 217 with the rotation mechanism 267, the operation of moving the boat 217 up or down with the boat elevator 115, the operation of opening and closing the shutter 219*s* with the shutter opening/closing mechanism 115*s*, and the like.

The controller 121 may be configured by installing, on the computer, the aforementioned program stored in an external memory device 123. The external memory device 123 may include, for example, a magnetic disc such as an HDD, an optical disc such as a CD, a magneto-optical disc such as an MO, a semiconductor memory such as a USB memory, and the like. The memory 121*c* or the external memory device 123 is configured as a computer-readable recording medium. Hereinafter, the memory 121*c* and the external memory device 123 will be generally and simply referred to as a "recording medium." When the term "recording medium" is used herein, it may indicate a case of including only the memory 121*c*, a case of including only the external memory device 123, or a case of including both the memory 121*c* and the external memory device 123. Furthermore, the program may be supplied to the computer by using a communication means such as the Internet or a dedicated line, instead of using the external memory device 123.

(2) Substrate Processing Process

As a process of manufacturing a semiconductor device by using the above-described substrate processing apparatus, a processing sequence example of selective growth (selective film formation) selectively growing and forming a film on a surface of a specific base among a plurality of types of bases exposed on a surface of a wafer 200 as a substrate will be described mainly with reference to FIGS. 4 and 6A to 6F. In the following descriptions, operations of respective parts constituting the substrate processing apparatus are controlled by the controller 121.

The processing sequence shown in FIG. 4 includes:

a step (surface modification) of modifying a surface of a base 200*a* to terminate the surface of the base 200*a* with a methyl group (Me), which is a hydrocarbon group, by supplying a DMATMS gas as a hydrocarbon group-containing gas to a wafer 200 having a first base (the base 200*a*) including a silicon oxide film (SiO film) and a second base (a base 200*b*) including a silicon nitride film (SiN film) exposed on the surface of the wafer 200; and a step (selective growth) of selectively forming a film on the surface of the base 200*b* by supplying a H$_2$O gas as an O- and H-containing gas to the wafer 200 after modifying the surface of the base 200*a*.

In the selective growth shown in FIG. 4, a pyridine gas as a catalyst and a BTCSM gas as a Si- and halogen-containing gas are further supplied to the wafer 200 respectively. Specifically, a silicon oxycarbide film (SiOC film) is formed as a film on the surface of the base 200*b* by performing a cycle a predetermined number of times (n times, where n is an integer of 1 or more), the cycle including non-simultaneously performing: a step of supplying the BTCSM gas and the pyridine gas to the wafer 200; and a step of supplying the H$_2$O gas and the pyridine gas to the wafer 200.

The processing sequence shown in FIG. 4 further includes a step of post-processing the wafer 200 after the selective growth by setting the temperature of the wafer 200 after the SiOC film is selectively formed on the surface of the base 200*b* to be equal to or higher than the temperature of the wafer 200 in film formation, specifically to be higher than the temperature of the wafer 200 in film formation.

In the present disclosure, for the sake of convenience, the above-described processing sequence may be denoted as follows. The same denotation may be used in modifications and the like to be described below.

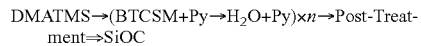

DMATMS→(BTCSM+Py→H$_2$O+Py)×$n$→Post-Treatment⇒SiOC

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer formed on a wafer". When the expression "a certain layer is formed on a wafer" is used in the present disclosure, it may mean that "a certain layer is formed directly on a surface of a wafer itself" or that "a certain layer is formed on a layer and the like formed on a wafer." When the term "substrate" is used in the present disclosure, it may be synonymous with the term "wafer."

(Wafer Charging and Boat Loading)

When the boat 217 is charged with a plurality of wafers 200 (wafer charging), the shutter 219*s* is moved by the shutter opening/closing mechanism 115*s* to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b.

Figure 6A:
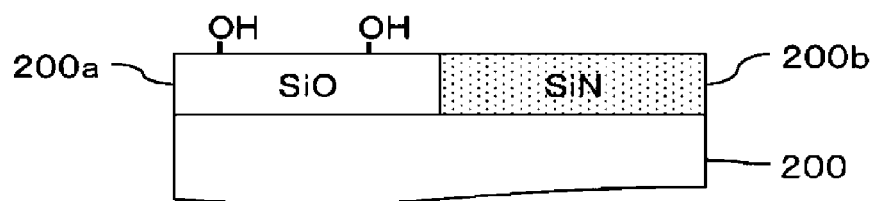
FIG. 6A is a partial enlarged cross-sectional view of a surface of a wafer 200 in which a base 200a including a silicon oxide film and a base 200b including a silicon nitride film are exposed on the surface.

As illustrated in FIG. 6A, a plurality of types of bases, for example, an oxygen (O)-containing film, that is, the base 200a including the SiO film as an oxide film, and an O-free film, that is, the base 200b including the SiN film as a nitride film, which is a non-oxidizing film, are exposed in advance on the surface of the wafer 200. The base 200a has a surface terminated with a hydroxyl group (OH group) over the entire area (entire surface). The base 200b has a surface not terminated with an OH group in many areas, that is, a surface terminated with the OH group in some areas.

(Pressure Regulation and Temperature Regulation)

The interior of the process chamber 201, that is, a space where the wafers 200 are placed, is vacuum-exhausted (decompression-exhausted) by the vacuum pump 246 to reach a desired pressure (vacuum degree). In this operation, the internal pressure of the process chamber 201 is measured by the pressure sensor 245, and the APC valve 244 is feedback-controlled based on the measured pressure information. Further, the wafers 200 in the process chamber 201 are heated by the heater 207 to have a desired temperature. In this operation, a degree of supplying electric power to the heater 207 is feedback-controlled based on the temperature information detected by the temperature sensor 263 such that the interior of the process chamber 201 has a desired temperature distribution. Further, the rotation of the wafers 200 by the rotation mechanism 267 begins. The exhaust of the interior of the process chamber 201 and the heating and rotation of the wafers 200 are continuously performed at least until the processing on the wafers 200 is completed.

(Surface Modification)

Then, the DMATMS gas is supplied to the wafer 200 having the base 200a and the base 200b exposed on the surface of the wafer 200.

Specifically, the valve 243a is opened to allow the DMATMS gas to flow into the gas supply pipe 232a. A flow rate of the DMATMS gas is regulated by the MFC 241a, and the DMATMS gas is supplied into the process chamber 201 via the nozzle 249a and is exhausted via the exhaust port 231a. In this operation, the DMATMS gas is supplied to the wafer 200 (DMATMS gas supply). In this operation, the valves 243e to 243g may be opened to allow the $N_2$ gas to be supplied into the process chamber 201 via the nozzles 249a to 249c, respectively.

Figure 6B:
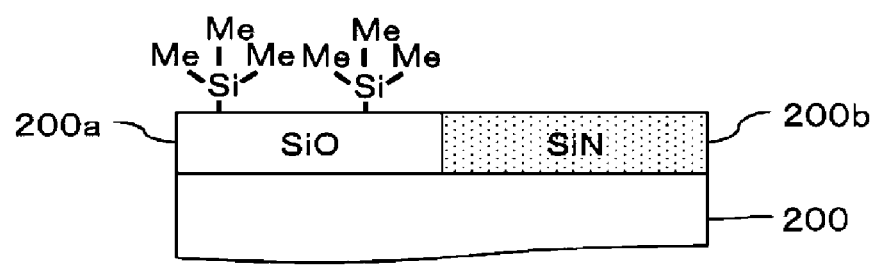
FIG. 6B is a partial enlarged cross-sectional view of the surface of the wafer 200 after a surface of the base 200a is modified to be terminated with a hydrocarbon group by supplying a hydrocarbon group-containing gas.

By supplying the DMATMS gas to the wafer 200 under a process condition to be described below, it is possible to selectively (preferentially) modify the surface of the base 200a of the bases 200a and 200b. Specifically, the OH group terminating the surface of the base 200a reacts with the DMATMS gas while adsorption of Si contained in DMATMS on the surface of the base 200b is suppressed, such that it is possible to selectively (preferentially) adsorb Si contained in DMATMS on the surface of the base 200a. This makes it possible to terminate the surface of the base 200a with the methyl group (Me) contained in DMATMS. Specifically, as illustrated in FIG. 6B, it is possible to terminate the surface of the base 200a with a trimethylsilyl group (Si-Me₃) contained in DMATMS. The methyl group (trimethylsilyl group) terminating the surface of the base 200a prevents adsorption of the BTCSM gas on the surface of the base 200a in selective growth to be described below such that the methyl group can act as an adsorption inhibitor that inhibits the progress of film formation reaction on the surface of the base 200a.

Further, in this step, Si contained in the DMATMS gas may be adsorbed on a portion of the surface of the base 200b, and the portion of the surface of the base 200b may be terminated with the methyl group, but an amount of termination thereof is small, and the amount of termination with the methyl group on the surface of the base 200a is overwhelmingly large. Such selective (preferential) termination is possible because the process condition in this step is a condition where the DMATMS gas does not undergo gas phase decomposition in the process chamber 201. Further, this is because many areas of the surface of the base 200b are not OH-terminated while the surface of the base 200a is OH-terminated over the entire area. In this step, since the DMATMS gas does not undergo gas phase decomposition in the process chamber 201, Si contained in DMATMS is not multiple-deposited on the surfaces of the bases 200a and 200b, and is selectively adsorbed on the surface of the base 200a, whereby the surface of the base 200a is selectively terminated with the methyl group.

After the surface of the base 200a is modified, the valve 243a is closed to stop the supply of the DMATMS gas into the process chamber 201. Then, the interior of the process chamber 201 is vacuum-exhausted to remove the gas and the like remaining in the process chamber 201 from the interior of the process chamber 201. At this time, the valves 243e to 243g are opened to supply the $N_2$ gas into the process chamber 201 via the nozzles 249a to 249c. The $N_2$ gas supplied from the nozzles 249a to 249c acts as a purge gas, whereby the interior of the process chamber 201 is purged (purge).

A process condition in DMATMS gas supply is exemplified as follows:

DMATMS gas supply flow rate: 1 to 3,000 sccm, specifically 1 to 500 sccm

DMATMS gas supply time: 1 second to 120 minutes, specifically 30 seconds to 60 minutes $N_2$ gas supply flow rate (per gas supply pipe): 0 to 20,000 sccm Processing temperature: room temperature (25 degrees C.) to 500 degrees C., specifically room temperature to 250 degrees C.

Processing pressure: 5 to 1,000 Pa

A process condition in purge is exemplified as follows:

$N_2$ gas supply flow rate (per gas supply pipe): 500 to 20,000 sccm $N_2$ gas supply time: 10 to 30 seconds Processing pressure: 1 to 30 Pa In the present disclosure, notation of a numerical range such as "5 to 1,000 Pa" means that a lower limit value and an upper limit value are included in the range. Therefore, for example, "5 to 1,000 Pa" means "equal to or larger than 5 Pa and equal to or smaller than 1,000 Pa." The same applies to other numerical ranges.

As the hydrocarbon group-containing gas, in addition to the DMATMS gas, for example, an aminosilane-based gas represented by the following chemical formula [1] can be used.

$$SiA_x[(NB_2)_{(4-x)}] \qquad [1]$$

Figure 5B:
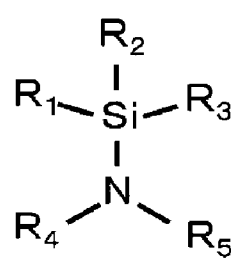
FIG. 5B is a diagram showing a chemical structural formula of a hydrocarbon group-containing gas containing a trialkylsilyl group and an amino group.
Figure 5C:
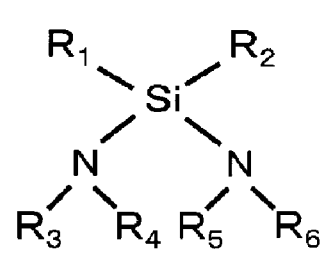
FIG. 5C is a diagram showing a chemical structural formula of a hydrocarbon group-containing gas containing a dialkylsilyl group and an amino group.

In the formula [1], the symbol A represents a hydrogen atom, an alkyl group such as a methyl group, an ethyl group, a propyl group, and a butyl group, or an alkoxy group such as a methoxy group, an ethoxy group, a propoxy group, and a butoxy group. The alkyl group may be not only a linear alkyl group but also a branched alkyl group such as an isopropyl group, an isobutyl group, a secondary butyl group, a tertiary butyl group, and the like. The alkoxy group may be not only a linear alkoxy group but also a branched alkoxy group such as an isopropoxy group, an isobutoxy group, and the like. The symbol B represents a hydrogen atom or an alkyl group such as a methyl group, an ethyl group, a propyl group, or a butyl group. The alkyl group may be not only a linear alkyl group but also a branched alkyl group such as an isopropyl group, an isobutyl group, a secondary butyl group, a tertiary butyl group, and the like. A plurality of A's may be the same as or different from each other, and two B's may be the same as or different from each other. The symbol x is an integer of 1 to 3. FIG. 5B illustrates the case when x is 3, that is, a chemical structural formula of aminosilane containing a trialkylsilyl group in which three alkyl groups and one amino group are bonded to Si, which is a central atom. Further, FIG. 5C illustrates the case when x is 2, that is, a chemical structural formula of aminosilane containing a dialkylsilyl group in which two alkyl groups and two amino groups are bonded to Si, which is the central atom. In these figures, $R_1$ to $R_6$ may be various functional groups exemplified as A and B, respectively.

As the inert gas, in addition to the $N_2$ gas, a rare gas such as an Ar gas, a He gas, a Ne gas, and a Xe gas may be used. The same applies to each step to be described below.

(Selective Growth)

Then, the following steps S1 and S2 are executed in sequence. In these steps, the output of the heater 207 is regulated such that the temperature of the wafer 200 is kept equal to or lower than the temperature of the wafer 200 in the surface modification, specifically lower than the temperature of the wafer 200 in the surface modification.

[Step S1]

In this step, a BTCSM gas and a pyridine gas are supplied to the wafer 200 in the process chamber 201, that is, the wafer 200 after the surface of the base 200a is selectively terminated with the methyl group.

Specifically, the valves 243b and 243d are opened to allow the BTCSM gas to flow into the gas supply pipe 232b and the pyridine gas to flow into the gas supply pipe 232d, respectively. Flow rates of the BTCSM gas and the pyridine gas are regulated by the MFCs 241b and 241d, respectively, and the BTCSM gas and the pyridine gas are supplied into the process chamber 201 via the nozzles 249b and 249a, respectively, are mixed in the process chamber 201, and are then exhausted via the exhaust port 231a. In this operation, the BTCSM gas and the pyridine gas are supplied to the wafer 200 (BTCSM gas+pyridine gas supply). At this time, the valves 243e to 243g may be opened to allow the $N_2$ gas to be supplied into the process chamber 201 via the nozzles 249a to 249c, respectively.

Figure 6C:
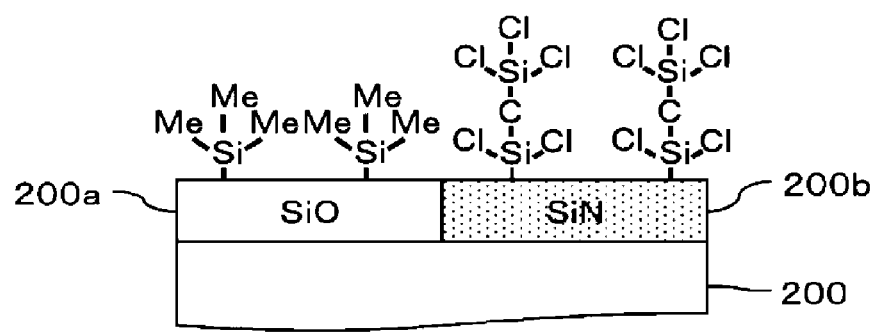
FIG. 6C is a partial enlarged cross-sectional view of the surface of the wafer 200 after a first layer containing silicon and carbon is selectively formed on a surface of the base 200b by supplying a silicon- and halogen-containing gas.

By supplying the BTCSM gas and the pyridine gas to the wafer 200 under the process condition to be described below, as illustrated in FIG. 6C, Si contained in the BTCSM gas may be selectively (preferentially) adsorbed on the surface of the base 200b while adsorption of Si contained in the BTCSM gas on the surface of the base 200a is suppressed. As a result, a Si-containing layer containing C and Cl having a thickness of, for example, less than one atomic layer (one molecular layer) to several atomic layers (several molecular layers) is formed as a first layer on the surface of the base 200b. The first layer becomes a layer containing a Si—C bond. In the present disclosure, the Si-containing layer containing C and Cl is also simply referred to as a Si-containing layer containing C or a SiC layer.

In this step, the pyridine gas acting as a catalyst is supplied together with the BTCSM gas, whereby the above-mentioned reaction may be carried out under a non-plasma atmosphere and under a low temperature condition to be described below. In this way, the first layer is formed under the non-plasma atmosphere and under the low temperature condition to be described below, whereby the methyl group terminating the surface of the base 200a may be maintained without being extinguished (desorbed) from the surface of the base 200a.

Further, in this step, when the first layer is formed, Si contained in the BTCSM gas may be adsorbed on a portion of the surface of the base 200a, but an amount of adsorption thereof is smaller than an amount of adsorption of Si on the surface of the base 200b. Such selective (preferential) adsorption is possible because the process condition in this step is a condition in which the BTCSM gas does not undergo the gas phase decomposition in the process chamber 201. This is also because the surface of the base 200a is terminated with the methyl group over the entire area, whereas many areas of the surface of the base 200b are not terminated with the methyl group. In this step, since the BTCSM gas does not undergo the gas phase decomposition in the process chamber 201, Si contained in the BTCSM is not multiple-deposited on the surfaces of the bases 200a and 200b, and is selectively adsorbed on the surface of the base 200b.

After the first layer is selectively formed on the surface of the base 200b, the valves 243b and 243d are closed to stop the supply of the BTCSM gas and the pyridine gas into the process chamber 201, respectively. Then, the gas and the like remaining in the process chamber 201 are removed from the process chamber 201 (purge) according to the same process sequence and process condition as in the purge in the surface modification.

A process condition in this step is exemplified as follows:
BTCSM gas supply flow rate: 1 to 2,000 sccm
Pyridine gas supply flow rate: 1 to 2,000 sccm
$N_2$ gas supply flow rate (per gas supply pipe): 0 to 20,000 sccm
Each gas supply time: 1 to 60 seconds
Processing temperature: room temperature to 120 degrees C., specifically room temperature to 90 degrees C.
Processing pressure: 133 to 1,333 Pa As the Si- and halogen-containing gas, in addition to the BTCSM gas, it may be possible to use an alkylene chlorosilane-based gas such as a 1,2-bis(trichlorosilyl)ethane $((SiCl_3)_2C_2H_4$, abbreviation: BTCSE) gas, an alkyl chlorosilane-based gas such as a 1,1,2,2-tetrachloro-1,2-dimethyldisilane $((CH_3)_2Si_2Cl_4$, abbreviation: TCDMDS) gas and a 1,2-dichloro-1,1,2,2-tetramethyldisilane $((CH_3)_4Si_2Cl_2$, abbreviation: DCTMDS) gas, or a gas containing a cyclic structure composed of Si and C and halogen, such as a 1,1,3,3-tetrachloro-1,3-disilacyclobutane $(C_2H_4Cl_4Si_2$, abbreviation: TCDSCB) gas. Further, as the Si- and halogen-containing gas, an inorganic chlorosilane-based gas such as a tetrachlorosilane $(SiCl_4$, abbreviation: STC) gas, a hexachlorodisilane $(Si_2Cl_6$, abbreviation: HCDS) gas, and an octachlorotrisilane $(Si_3Cl_8$, abbreviation: OCTS) gas may be used. Even when the inorganic chlorosilane-based gas is used, the reaction as described above may be caused except that the first layer does not contain C.

As the catalyst, in addition to the pyridine gas, it may be possible to use a cyclic amine-based gas such as an aminopyridine $(C_5H_6N_2)$ gas, a picoline $(C_6H_7N)$ gas, a lutidine $(C_7H_9N)$ gas, a piperazine $(C_4H_{10}N_2)$ gas, and a piperidine $(C_5H_{11}N)$ gas, or a chain amine-based gas such as a triethylamine $((C_2H_5)_3N$, abbreviation: TEA) gas and a diethylamine $((C_2H_5)_2NH$, abbreviation: DEA) gas. The same applies to step S2 to be described below.

[Step S2]

After the first layer is formed, a $H_2O$ gas and a pyridine gas are supplied to the wafer 200 in the process chamber 201, that is, the first layer selectively formed on the surface of the base 200b.

Specifically, the valves 243c and 243d are opened to allow the $H_2O$ gas to flow into the gas supply pipe 232c and the pyridine gas to flow into the gas supply pipe 232d, respectively. The flow rates of the $H_2O$ gas and the pyridine gas are regulated by the MFCs 241c and 241d and supplied into the process chamber 201 via the nozzles 249c and 249a respectively. Then, the $H_2O$ gas and the pyridine gas are mixed with each other in the process chamber 201, and exhausted via the exhaust port 231a. In this operation, the $H_2O$ gas and the pyridine gas are supplied to the wafer 200 ($H_2O$ gas+pyridine gas supply). At this time, the valves 243e to 243g may be opened to allow the $N_2$ gas to be supplied into the process chamber 201 via the nozzles 249a to 249c respectively.

Figure 6D:
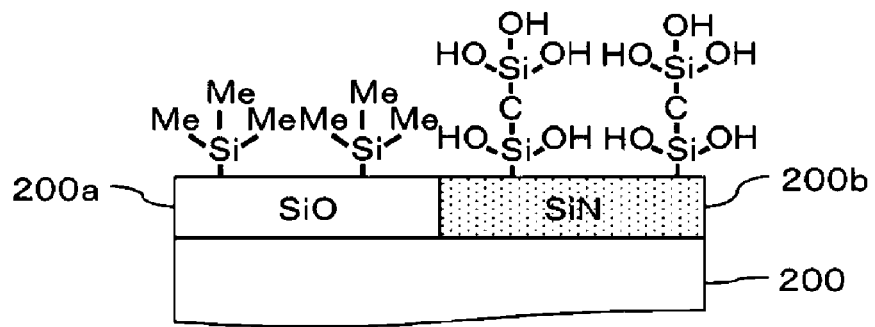
FIG. 6D is a partial enlarged cross-sectional view of the surface of the wafer 200 after the first layer selectively formed on the surface of the base 200b is oxidized and modified into a second layer containing silicon, oxygen and carbon by supplying an oxygen- and hydrogen-containing gas.

By supplying the $H_2O$ gas and the pyridine gas to the wafer 200 under the process condition to be described below, as illustrated in FIG. 6D, it is possible to oxidize at least a portion of the first layer formed on the surface of the base 200b in step S1. As a result, a Si-containing layer containing O and C having a thickness of, for example, less than one atomic layer (one molecular layer) to several atomic layers (several molecular layers) is formed as a second layer on the surface of the base 200b. When the second layer is formed, at least some of Si—C bonds contained in the first layer are retained without being cut, and are introduced into (remain in) the second layer as they are. As a result, the second layer becomes a layer containing the Si—C bonds. In the present disclosure, the Si-containing layer containing O and C is also simply referred to as a SiOC layer. When the second layer is formed, impurities such as Cl and the like contained in the first layer form a gaseous substance containing at least Cl in the process of oxidation reaction by the $H_2O$ gas, and are discharged from the process chamber 201. The second layer becomes a layer having impurities such as Cl less than those in the first layer.

In this step, the pyridine gas acting as the catalyst is supplied together with the $H_2O$ gas, whereby the above-mentioned reaction may be carried out under a non-plasma atmosphere and under a low temperature condition as will be described below. In this way, the second layer is formed under the non-plasma atmosphere and under the low temperature condition to be described below, whereby the methyl group terminating the surface of the base 200a may be maintained without being extinguished (desorbed) from the surface of the base 200a.

After the first layer formed on the surface of the base 200b is oxidized to be changed (converted) into the second layer, the valves 243c and 243d are closed to stop the supply of the $H_2O$ gas and the pyridine gas into the process chamber 201, respectively. Then, the gas and the like remaining in the process chamber 201 are removed from the process chamber 201 (purge) according to the same process sequence and process condition as in the purge in the surface modification.

A process condition in this step is exemplified as follows:
$H_2O$ gas supply flow rate: 1 to 2,000 sccm
Pyridine gas supply flow rate: 1 to 2,000 sccm
$N_2$ gas supply flow rate (per gas supply pipe): 0 to 20,000 sccm
Each gas supply time: 1 to 60 seconds
Processing temperature: room temperature to 120 degrees C., specifically room temperature to 100 degrees C.
Processing pressure: 133 to 1,333 Pa As the O- and H-containing gas, in addition to the $H_2O$ gas, an O-containing gas containing an O—H bond, such as a hydrogen peroxide ($H_2O_2$) gas, may be used. Further, as the O- and H-containing gas, an O—H bond-free O-containing gas such as hydrogen ($H_2$) gas+oxygen ($O_2$) gas and $H_2$ gas+ozone ($O_3$) gas may be used.

[Performing Predetermined Number of Times]

Figure 6E:
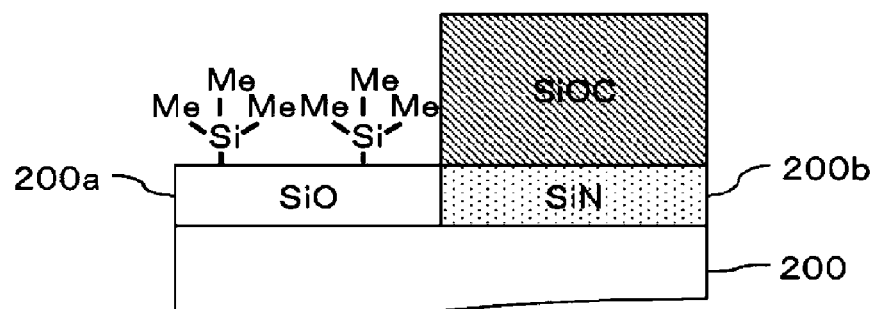
FIG. 6E is a partial enlarged cross-sectional view of the surface of the wafer 200 after a silicon oxycarbide film is selectively formed on the surface of the base 200b.

By performing a cycle a predetermined number of times (n times, where n is an integer of 1 or more), the cycle including non-simultaneously, that is, without synchronization, performing the above-described steps S1 and S2, it is possible to selectively form a SiOC film on the surface of the base 200b of the bases 200a and 200b exposed on the surface of the wafer 200, as illustrated in FIG. 6E. The above-described cycle may be performed a plurality of times. That is, a thickness of the second layer formed per cycle may be set thinner than a desired film thickness, and the above-described cycle may be performed multiple times until the film thickness of a film formed by laminating the second layers becomes equal to the desired film thickness.

Further, when steps S1 and S2 are carried out, since the methyl group terminating the surface of the base 200a is maintained without being extinguished from the surface of the base 200a as described above, a SiOC film is not formed on the surface of the base 200a. However, for example, when the surface of the base 200a is not sufficiently modified for some reason, a SiOC film may be formed very slightly on the surface of the base 200a. However, even in this case, the thickness of the SiOC film formed on the surface of the base 200a is much thinner than the thickness of the SiOC film formed on the surface of the base 200b. In the present disclosure, "selectively forming a SiOC film on the surface of the base 200b" of the bases 200a and 200b means not only a case where no SiOC film is formed on the surface of the base 200a, but also as described above, a case where a very thin SiOC film is formed on the surface of the base 200a.

(Post-Process)

Figure 6F:
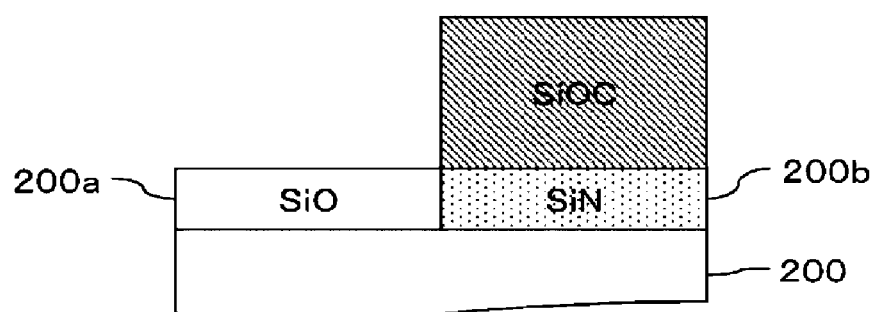
FIG. 6F is a partial enlarged cross-sectional view of the surface of the wafer 200 after a hydrocarbon group terminating the surface of the base 200a is removed from the surface of the base 200a by post-processing the wafer 200 shown in FIG. 6E.

After the selective growth is completed, the wafer 200 after the selective growth is post-processed by regulating the output of the heater 207 to set the internal temperature of the process chamber 201, that is, the temperature of the wafer 200 after the SiOC film is selectively formed on the surface of the base 200b, to be equal to or higher than the temperature of the wafer 200 in the selective growth, specifically to be higher than the temperature of the wafer 200 in the selective growth. Thus, as illustrated in FIG. 6F, it is possible to allow the methyl group terminating the surface of the base 200a to be desorbed and removed from the surface of the base 200a, or invalidate the function of the methyl group as the inhibitor. As a result, it is possible to reset a surface state of the base 200a and perform a film-forming process and the like on the surface of the base 200a in the subsequent step. This step may be performed in a state where a gas (assist gas), such as a $N_2$ gas, a $H_2$ gas, and an $O_2$ gas, that promotes removal (desorption) of the methyl groups, is supplied into the process chamber 201, or may be performed in a state where the supply of the assist gas into the process chamber 201 is stopped.

A process condition in this step is exemplified as follows:
Assist gas supply flow rate: 0 to 50,000 sccm
Process gas supply time: 1 to 18,000 seconds
Processing temperature: 120 to 1,000 degrees C., specifically 400 to 700 degrees C.
Processing pressure: 1 to 120,000 Pa (After-Purge and Returning to Atmospheric Pressure)

After the selective formation of the SiOC film on the surface of the base 200b is completed and the reset of the surface state of the base 200a is completed, the $N_2$ gas as a purge gas is supplied into the process chamber 201 from each of the nozzles 249a to 249c and is exhausted via the exhaust port 231a. Thus, the interior of the process chamber 201 is purged to remove the gas and the reaction byproducts remaining within the process chamber 201 from the interior of the process chamber 201 (after-purge). Thereafter, the internal atmosphere of the process chamber 201 is substituted with an inert gas (inert gas substitution) and the internal pressure of the process chamber 201 is returned to an atmospheric pressure (returning to atmospheric pressure).

(Boat Unloading and Wafer Discharging)

Thereafter, the seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat is unloaded, the shutter 219s is moved such that the lower end opening of the manifold 209 is sealed by the shutter 219s via the O-ring 220c (shutter closing). The processed wafers 200 are unloaded to the outside of the reaction tube 203, and then are subsequently discharged from the boat 217 (wafer discharging).

(3) Effects of the Embodiments

According to the embodiments, one or more effects set forth below may be achieved.

(a) In the surface modification, by terminating the surface of the base 200a with the hydrocarbon group and performing the film formation while maintaining the state where the surface of the base 200a is terminated with the hydrocarbon group in the selective growth, it is possible to selectively form the SiOC film on the surface of the base 200b of the bases 200a and 200b exposed on the surface of the wafer 200. This makes it possible to simplify a process of processing a film, such as omission of a patterning process including photolithography, for example when manufacturing a semiconductor device. As a result, it is possible to improve a productivity of the semiconductor device, thereby reducing a manufacturing cost.

After modifying the surface of the base 200a terminated with the hydrocarbon group such as an alkyl group by using the DMATMS gas and the like, when it is intended to form an oxide film such as a SiOC film on the surface of the base 200b by using an oxidizing agent such as $O_3$ gas), $O_2$ plasma, or $O_2$ gas+$H_2$ gas, the hydrocarbon group may be easily desorbed from the surface of the base 200a by the oxidizing agent. Therefore, when it is intended to selectively form the oxide film on the surface of the base 200b, it is difficult to think of using the hydrocarbon group, which is vulnerable to the oxidizing agent, as an inhibitor. However, as a result of careful research, the present disclosers have found that by performing some control when forming the oxide film, specifically, for example, by using a $H_2O$ gas as the oxidizing agent, setting the temperature condition to be the low temperature condition as described above, and performing the selective growth in the non-plasma atmosphere, desorption of the hydrocarbon group acting as the inhibitor from the surface of the base 200a can be suppressed even when the oxidizing agent is used, and the hydrocarbon group can be retained on the surface of the base 200a. The present disclosure is based on these findings found by the present disclosers.

(b) In the surface modification, by terminating the surface of the base 200a with the alkyl group such as the methyl group which is a kind of hydrocarbon group, it is possible to more reliably and selectively form the SiOC film on the surface of the base 200b of the bases 200a and 200b exposed on the surface of the wafer 200. That is, it is possible to enhance a selectivity in the selective growth.

(c) In the surface modification, by terminating the surface of the base 200a with the alkylsilyl group, particularly with the trialkylsilyl group, it is possible to enhance the selectivity in the selective growth. Such an effect is more remarkable when the surface of the base 200a is terminated with the trialkylsilyl group having three alkyl groups bonded to Si or the dialkylsilyl group having two alkyl groups bonded to Si than when the surface of the base 200a is terminated with the monoalkylsilyl group having one alkyl group bonded to Si.

(d) In the surface modification, by using the gas containing the amino group in addition to the hydrocarbon group such as alkyl group, as the hydrocarbon group-containing gas, such as the DMATMS gas, it is possible to efficiently perform the process of terminating the surface of the base 200a with the hydrocarbon group. As a result, the above-described effects can be obtained more reliably. In addition, it is possible to enhance the productivity of substrate processing.

(e) In the selective growth, by using the catalyst such as the pyridine gas, it is possible to perform the film-forming process in the non-plasma atmosphere. In addition, it is possible to lower the processing temperature. As a result, in the selective growth, it is possible to suppress the desorption of the hydrocarbon group such as the methyl group terminating the surface of the base 200a from the surface of the base 200a. As a result, it is possible to increase the selectivity in the selective growth. Further, since the selective growth is performed in the non-plasma atmosphere, plasma damage to the wafer 200 can be avoided, which makes it possible to apply this method to a process in which the plasma damage is a concern.

(f) In the selective growth, by using the O- and H-containing gas such as the $H_2O$ gas as the oxidizing agent, it is possible to suppress the desorption of the hydrocarbon group such as the methyl group terminating the surface of the base 200a from the surface of the base 200a in the selective growth. As a result, it is possible to increase the selectivity in the selective growth.

(g) Since the base 200a includes the SiO film and the base 200b includes the SiN film which is a film other than the SiO film, it is possible to reliably perform the process of selectively terminating the surface of the base 200a of the bases 200a and 200b exposed on the surface of the wafer 200 with the hydrocarbon group such as the methyl group in the surface modification. This makes it possible to enhance the selectivity in the selective growth.

(h) By setting the temperature of the wafer 200 in the selective growth to be equal to or lower than the temperature of the wafer 200 in the surface modification, it is possible to reliably suppress the desorption of the hydrocarbon group such as the methyl group terminating the surface of the base 200a from the surface of the base 200a in the selective growth. As a result, it is possible to increase the selectivity in the selective growth.

(i) By setting the temperature of the wafer 200 in the selective growth to be lower than the temperature of the wafer 200 in the surface modification, it is possible to reliably suppress the desorption of the hydrocarbon group such as the methyl group terminating the surface of the base 200a from the surface of the base 200a in the selective growth. As a result, it is possible to further increase the selectivity in the selective growth.

(j) By setting the temperature of the wafer 200 in the selective growth to be equal to or lower than or to be lower than the temperature of the wafer 200 in the surface modification and increasing the temperature of the wafer 200 within that range, it is possible to further increase the selectivity in the selective growth.

(k) By setting the temperature of the wafer 200 in the selective growth to be equal to or lower than or to be lower than the temperature of the wafer 200 in the surface modification and increasing the temperature of the wafer 200 within that range, it is possible to appropriately reduce a film formation rate of the SiOC film formed in the selective growth. As a result, the thickness of the formed SiOC film can be finely adjusted, which makes it possible to achieve precise adjustment to a target film thickness. That is, it is possible to improve a film thickness controllability in the selective growth.

(l) After the selective growth, by performing the post-process in which the temperature of the wafer 200 is set to be equal to or higher than the temperature of the wafer 200 in the selective growth, it is possible to desorb and remove the hydrocarbon group such as the methyl group terminating the surface of the base 200a from the surface of the base 200a. This makes it possible to perform a film formation and the like on the surface of the base 200a in the subsequent step. Further, by this post-process, impurities in the SiOC film formed on the surface of the base 200b can be removed, which makes it possible to make the SiOC film dense, thereby improving a film quality of the SiOC film.

(m) After the selective growth, by performing the post-process in which the temperature of the wafer 200 is set to be higher than the temperature of the wafer 200 in the selective growth, it is possible to effectively desorb and remove the hydrocarbon group such as the methyl group terminating the surface of the base 200a from the surface of the base 200a. This makes it possible to appropriately perform the film formation and the like on the surface of the base 200a in the subsequent step. Further, by this post-process, impurities in the SiOC film formed on the surface of the base 200b can be sufficiently removed, which makes it possible to make the SiOC film sufficiently dense, thereby further improving the film quality of the SiOC film.

(n) By performing the post-process in the state where the assist gas such as the $N_2$ gas, the $H_2$ gas, the $O_2$ gas, and the $H_2O$ gas is supplied into the process chamber 201, it is possible to efficiently and effectively desorb and remove the hydrocarbon group such as the methyl group terminating the surface of the base 200a from the surface of the base 200a. This makes it possible to appropriately perform the film formation and the like on the surface of the base 200a in the subsequent step. Further, by this post-process, impurities in the SiOC film formed on the surface of the base 200b can be efficiently and effectively removed, which makes it possible to further improving the film quality of the SiOC film.

(o) The above-described effects can be obtained similarly even when a hydrocarbon group-containing gas other than the DMATMS gas is used, when a Si- and halogen-containing gas other than the BTCSM gas is used, when an O- and H-containing gas other than the $H_2O$ gas is used, when a catalyst other than the pyridine gas is used, or when an inert gas other than the $N_2$ gas is used.

(4) Modifications

The substrate process sequences in the embodiments can be changed as the following modifications. These modifications may be used in proper combination. Unless otherwise specified, a processing procedure and a process condition in each step of each modification can be the same as the processing procedure and process condition in each step of the above-described substrate process sequence.

(Modification 1)

Before the surface modification is performed, the surface of the wafer 200 may be subjected to a cleaning process (DHF cleaning) using, for example, a diluted hydrofluoric acid (DHF) aqueous solution, that is, a hydrogen fluoride (HF) aqueous solution, to remove a natural oxide film formed on the surface of at least one selected from the group of the base 200a and the base 200b. This modification can also obtain the same effects as the above-described embodiments. Further, according to this modification, it is possible to reliably terminate the surface of the base 200a with the OH group and thus to reliably perform the process of selectively terminating the surface of the base 200a with the methyl group in the subsequent surface modification. This makes it possible to increase the selectivity in the selective growth.

(Modification 2)

In the post-process, an oxidizing agent or radicals may be supplied to the wafer 200 after the SiOC film is selectively formed on the surface of the base 200b, to adsorb and remove the methyl group terminating the surface of the base 200a from the surface of the base 200a and reset a surface state of the base 200a (oxidizing agent or radicals supply). As the oxidizing agent, a $H_2O$ gas, a $H_2O_2$ gas, an $O_3$ gas, $H_2$ gas+$O_2$ gas, $H_2$ gas+$O_3$ gas), and the like may be used. As the radicals, O-containing radicals (O*), N-containing radicals (N*), Ar-containing radicals (Ar*), He-containing radicals (He*), and the like may be used. These radicals are contained in oxygen plasma, nitrogen plasma, argon plasma, and helium plasma generated by plasma-exciting an O-containing gas, a N-containing gas, an Ar-containing gas, and a He-containing gas, respectively. According to this modification, it is possible to positively adsorb and remove the methyl group terminating the surface of the base 200a from the surface of the base 200a. In addition, it is possible to positively remove impurities in the SiOC film formed on the surface of the base 200b, thereby improving the film quality of the SiOC film. Further, this modification may also be performed in combination with the post-process in the above-described embodiments. In this case, it is possible to more reliably remove the methyl group terminating the surface of the base 200a from the surface of the base 200a, and it is possible to further improve the film quality of the SiOC film formed on the surface of the base 200b.

A process condition when supplying a $H_2O$ gas as the oxidizing agent is exemplified as follows:

$H_2O$ gas supply flow rate: 100 to 50,000 sccm $H_2O$ gas supply time: 1 to 18,000 seconds Processing temperature: 120 to 1,000 degrees C., specifically 400 to 700 degrees C.

Processing pressure: 1 to 120,000 Pa

A process condition when supplying a $H_2O_2$ gas as the oxidizing agent is exemplified as follows:

$H_2O_2$ gas supply flow rate: 100 to 50,000 sccm $H_2O_2$ gas supply time: 1 to 18,000 seconds Processing temperature: 120 to 1,000 degrees C., specifically 400 to 700 degrees C.

Processing pressure: 1 to 120,000 Pa

A process condition when supplying an $O_3$ gas) as the oxidizing agent is exemplified as follows:

$O_3$ gas) supply flow rate: 100 to 50,000 sccm $O_3$ gas) supply time: 1 to 18,000 seconds Processing temperature: 120 to 1,000 degrees C., specifically 400 to 700 degrees C.

Processing pressure: 1 to 120,000 Pa

A process condition when supplying H₂ gas+02 gas as the oxidizing agent is exemplified as follows:

H₂ gas supply flow rate: 100 to 50,000 sccm
O₂ gas supply flow rate: 100 to 50,000 sccm
Each gas supply time: 1 to 18,000 seconds
Processing temperature: 400 to 1,000 degrees C., specifically 400 to 700 degrees C.
Processing pressure: 1 to 2,000 Pa, specifically 1 to 1,000 Pa A process condition when supplying H₂ gas+O₃ gas) as the oxidizing agent is exemplified as follows:

H₂ gas supply flow rate: 100 to 50,000 sccm
O₃ gas) supply flow rate: 100 to 50,000 sccm
Each gas supply time: 1 to 18,000 seconds
Processing temperature: 400 to 1,000 degrees C., specifically 400 to 700 degrees C.
Processing pressure: 1 to 2,000 Pa, specifically 1 to 1,000 Pa A process condition when supplying O* as radicals is exemplified as follows:

O₂ gas supply flow rate: 100 to 50,000 sccm
O₂ gas supply time: 1 to 18,000 seconds
RF power: 50 to 1,500 W
Processing temperature: 25 to 1,000 degrees C.
Processing pressure: 1 to 1,000 Pa A process condition when supplying N* as radicals is exemplified as follows:

N₂ gas supply flow rate: 100 to 50,000 sccm
N₂ gas supply time: 1 to 18,000 seconds
RF power: 50 to 1,500 W
Processing temperature: 25 to 1,000 degrees C.
Processing pressure: 1 to 1,000 Pa A process condition when supplying Ar* as radicals is exemplified as follows:

Ar gas supply flow rate: 100 to 50,000 sccm
Ar gas supply time: 1 to 18,000 seconds
RF power: 50 to 1,500 W
Processing temperature: 25 to 1,000 degrees C.
Processing pressure: 1 to 1,000 Pa A process condition when supplying He* as radicals is exemplified as follows:

He gas supply flow rate: 100 to 50,000 sccm
Gas supply time: 1 to 18,000 seconds
RF power: 50 to 1,500 W
Processing temperature: 25 to 1,000 degrees C.
Processing pressure: 1 to 1,000 Pa

OTHER EMBODIMENTS

The embodiments of the present disclosure have been described above in detail. However, the present disclosure is not limited to the aforementioned embodiments, but may be variously modified without departing from the subject matter of the present disclosure.

For example, as in a process sequence described below, in the selective growth, a silicon oxide film (SiO film) may be formed as a film on the surface of the base 200b by performing a cycle a predetermined number of times (n times, where n is an integer of 1 or more), the cycle including non-simultaneously performing: a step of supplying a HCDS gas and a pyridine gas to the wafer 200; and a step of supplying a H₂O gas and a pyridine gas to the wafer 200. A process condition in the step of supplying the HCDS gas and the pyridine gas to the wafer 200 may be the same as the process condition in step S1 of the above-described embodiments. A process condition in the step of supplying the H₂O gas and the pyridine gas to the wafer 200 can be the same as the process condition in step S2 of the above-described embodiments. Even in this case, the same effects as the above-described embodiments can be obtained.

DMATMS→(HCDS+Py→H₂O+Py)×n→Post-Treatment⇒SiO

Further, for example, as in the process sequence described below, a post-process may not be performed after the selective growth is performed. Even in this case, the same effects as the above-described embodiments may be obtained except for the effects by the post-process. Depending on a step performed after the selective growth, the surface state of the base 200a may not be reset. In that case, the post-process may not be performed.

DMATMS→(BTCSM+Py→H₂O+Py)×n⇒SiOC

DMATMS→(HCDS+Py→H₂O+Py)×n⇒SiO

Further, for example, in the surface modification, the supply of the DMATMS gas to the wafer 200 and the purge may be alternately performed a plurality of times. That is, the supply of the DMATMS gas to the wafer 200 may be intermittently performed with the purge performed between the supplies of the DMATMS. In this case, by the purge, it is possible to terminate the surface of the base 200a with the methyl group contained in DMATMS while removing residual physical adsorption components and the like of the DMATMS gas adsorbed on the surface of the wafer 200, which makes it possible to increase a density of the methyl group in the surface of the base 200a. As a result, it is possible to further increase the selectivity in the selective growth. Further, it is possible to reduce an amount of DMATMS gas used.

Further, for example, in the surface modification, the DMATMS gas may be supplied to the wafer 200 with the exhaust system closed, that is, with the APC valve 244 fully closed. That is, in the surface modification, the DMATMS gas may be confined in the process chamber 201. In this case, it is possible to distribute the DMATMS gas over the entire area in the process chamber 201 and the entire area within the surface of the wafer 200, so that the surface of the base 200a in the wafer 200 can be uniformly terminated with the methyl group. As a result, it is possible to further increase the selectivity in the selective growth. Further, it is possible to significantly reduce the amount of DMATMS gas used.

Further, in the surface modification, the act of confining the DMATMS gas in the process chamber 201 and the purge may be alternately performed a plurality of times. That is, the act of confining the DMATMS gas in the process chamber 201 is intermittently performed with the purge performed between the acts of confining the DMATMS gas. In this case, by the purge, it is possible to terminate the surface of the base 200a with the methyl group contained in DMATMS while removing residual physical adsorption components and the like of the DMATMS gas adsorbed on the surface of the wafer 200, which makes it possible to increase the density of the methyl group in the surface of the base 200a. As a result, it is possible to further increase the selectivity in the selective growth.

Further, for example, in the selective growth, not only the silicon-based oxide film such as the SiOC film or the SiO film, but also a metal-based oxide film such as an aluminum oxide film (AlO film), a titanium oxide film (TiO film), a hafnium oxide film (HfO film), or a zirconium oxide film (ZrO film) may be formed. In these cases, the selective growth may be performed according to the same process procedures as the process conditions in the above-described embodiments by using the above-mentioned hydrocarbon group-containing gas, a precursor containing a metal element such as Al, Ti, Hf, and Zr, the above-mentioned oxidizing agent, and the like. Even in this case, the same effects as those of the above-described embodiments can be obtained. Further, when forming the metal-based oxide film, the supply of the catalyst such as pyridine may be omitted.

Recipes used in each process may be provided individually according to processing contents and may be stored in the memory 121*c* via a telecommunication line or the external memory device 123. Moreover, at the beginning of each process, the CPU 121*a* may properly select an appropriate recipe from a plurality of recipes stored in the memory 121*c* according to the processing contents. Thus, it is possible to form films of various kinds, composition ratios, qualities, and thicknesses with enhanced reproducibility by using a single substrate processing apparatus. Further, it is possible to reduce an operator's burden and to quickly start each process while avoiding an operation error.

The recipes mentioned above are not limited to newly-provided ones but may be provided, for example, by modifying existing recipes that are already installed in the substrate processing apparatus. When the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

The examples in which a film is formed by using a batch-type substrate processing apparatus configured to process a plurality of substrates at a time have been described in the above-described embodiments. The present disclosure is not limited to the above-described embodiments, but may be suitably applied, for example, to a case where a film is formed by using a single-wafer type substrate processing apparatus configured to process a single substrate or several substrates at a time. In addition, the examples in which a film is formed by using a substrate processing apparatus provided with a hot-wall-type process furnace have been described in the above-described embodiments. The present disclosure is not limited to the above-described embodiments, but may be suitably applied to a case where a film is formed by using a substrate processing apparatus provided with a cold-wall-type process furnace.

Even in the case of using these substrate processing apparatuses, each process may be performed according to the same processing procedures and process conditions as those in the above-described embodiments, and the same effects as those of the above-described embodiments may be achieved.

The above-described embodiments may be used in proper combination. The processing procedures and process conditions used in this case may be the same as, for example, the processing procedures and process conditions of the above-described embodiments.

EXAMPLES

As Samples 1 to 6, SiOC films are formed on surfaces of bases exposed on surfaces of wafers according to the process sequences of the above-described embodiments. The bases of Samples 1 to 6 are a surface of a silicon wafer (single crystal Si), an amorphous carbon film (a-C film), a SiO film, an aluminum oxide film (AlO film), a SiN film, and a titanium nitride film (TiN film) in this order. The process condition in each step is a predetermined condition within a range of the process condition in each step of the above-described embodiments, and is the same condition in each sample.

Figure 7:
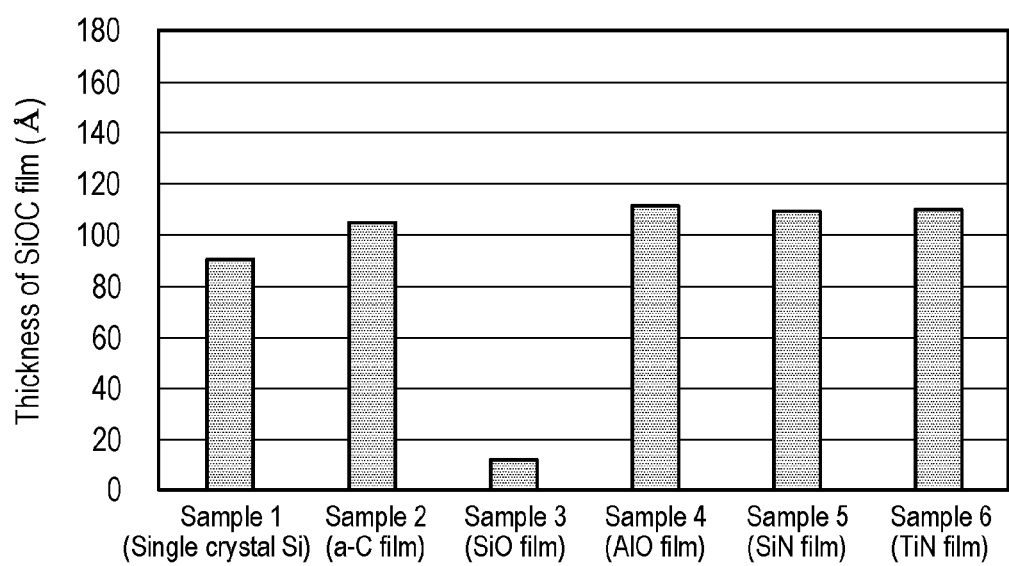
FIG. 7 is a diagram showing measurement results of thicknesses of silicon oxycarbide films formed on surfaces of various bases exposed on a surface of a wafer.

Then, thicknesses of the SiOC films formed in Samples 1 to 6 are measured. FIG. 7 shows measurement results of the thicknesses of the SiOC films. In FIG. 7, a vertical axis represents the thickness (Å) of the SiOC film formed on the surface of the base, and a horizontal axis represents Samples 1 to 6 in this order.

As shown in FIG. 7, it is found that the thickness of the SiOC film in Sample 3 by using the SiO film as the base is much thinner than the thicknesses of the SiOC films in the other samples. That is, it is found that the SiOC film may be selectively formed on the surfaces of various bases (single crystal Si, a-C film, AlO film, SiN film, and TiN film) other than the SiO film, among the plural types of bases exposed on the surface of the wafer, according to the process sequence of the above-described embodiments.

According to the present disclosure in some embodiments, it is possible to increase the selectivity in the selective growth.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   providing a substrate having a first base and a second base on its surface;
   (a) modifying a surface of the first base to be terminated with a hydrocarbon group by supplying a hydrocarbon group-containing gas to the substrate; and
   (b) forming a film on a surface of the second base by supplying an oxygen- and hydrogen-containing gas to the substrate after modifying the surface of the first base.

2. The method of claim 1, wherein (b) includes supplying a catalyst to the substrate.

3. The method of claim 1, wherein (b) includes supplying a silicon- and halogen-containing gas or a gas containing a metal element to the substrate.

4. The method of claim 1, wherein (b) includes performing a cycle a predetermined number of times, the cycle including:
   supplying a silicon- and halogen-containing gas and a catalyst to the substrate; and
   supplying the oxygen- and hydrogen-containing gas and the catalyst to the substrate.

5. The method of claim 1, wherein a temperature of the substrate in (b) is set to be equal to or lower than a temperature of the substrate in (a).

6. The method of claim 1, wherein a temperature of the substrate in (b) is set to be lower than a temperature of the substrate in (a).

7. The method of claim 5, wherein (b) includes controlling a selectivity to increase by regulating the temperature of the substrate to increase.

8. The method of claim 5, wherein (b) includes controlling a film formation rate to decrease by regulating the temperature of the substrate to increase.

9. The method of claim 1, further comprising: (c) removing the hydrocarbon group terminating the surface of the first base by supplying an oxidizing agent or radicals to the substrate after the film is formed on the surface of the second base.

10. The method of claim 1, further comprising: (c) removing the hydrocarbon group terminating the surface of the first base by setting a temperature of the substrate after the film is formed on the surface of the second base to be equal to or higher than a temperature of the substrate in (b).

11. The method of claim 1, further comprising: (c) removing the hydrocarbon group terminating the surface of the first base by setting a temperature of the substrate after the film is formed on the surface of the second base to be higher than a temperature of the substrate in (b).

12. The method of claim 1, further comprising: (d) terminating the surface of the first base with a hydroxyl group before performing (a).

13. The method of claim 1, wherein the hydrocarbon group includes an alkyl group.

14. The method of claim 1, wherein the hydrocarbon group includes an alkylsilyl group.

15. The method of claim 1, wherein the hydrocarbon group-containing gas further contains an amino group.

16. The method of claim 1, wherein the oxygen- and hydrogen-containing gas is a $H_2O$ gas.

17. The method of claim 1, wherein the first base is an oxide film, and the second base is a film other than the oxide film.

18. The method of claim 1, wherein (a) and (b) are performed in a non-plasma atmosphere.

19. A non-transitory computer-readable recording medium recording a program that causes, by a computer, a substrate processing apparatus to perform a process comprising:
   providing a substrate having a first base and a second base on its surface;
   (a) modifying a surface of the first base to be terminated with a hydrocarbon group by supplying a hydrocarbon group-containing gas to the substrate; and
   (b) forming a film on a surface of the second base by supplying an oxygen- and hydrogen-containing gas to the substrate after modifying the surface of the first base.

20. The method of claim 1, wherein (b) includes performing a cycle a predetermined number of times, the cycle including:
   (b1) forming a first layer on the substrate by supplying a silicon- and halogen-containing gas or a gas containing a metal element; and
   (b2) forming a second layer on the substrate by oxidizing the first layer by supplying the oxygen- and hydrogen-containing gas.

21. The method of claim 1, further comprising:
   (c) controlling a temperature of the substrate, where the film has been formed on the surface of the second base, to be equal to or higher than a temperature of the substrate in (b) such that the hydrocarbon group, with which the surface of the first base is terminated, no longer functions as an inhibitor.

22. The method of claim 1, further comprising:
   (c) controlling a temperature of the substrate, where the film has been formed on the surface of the second base, to be higher than a temperature of the substrate in (b) to invalidate a function of the hydrocarbon group with which the surface of the first base is terminated, as an inhibitor.

23. The method of claim 1, wherein (a) includes one selected from the group of:
   alternately performing the act of supplying the hydrocarbon group-containing gas and purging a space where the substrate is present, a predetermined number of times;
   confining the hydrocarbon group-containing gas in the space; and
   alternately performing confining the hydrocarbon group-containing gas in the space and purging the space, a predetermined number of times.

24. A method of manufacturing a semiconductor device, comprising the method claim 1.

* * * * *